United States Patent [19]

Coller et al.

[11] Patent Number: 4,696,525

[45] Date of Patent: Sep. 29, 1987

[54] SOCKET FOR STACKING INTEGRATED CIRCUIT PACKAGES

[75] Inventors: James R. Coller, Kernersville; Joseph R. Goodman, Walkertown, both of N.C.

[73] Assignee: AMP Incorporated, Harrisburg, Pa.

[21] Appl. No.: 809,091

[22] Filed: Dec. 13, 1985

[51] Int. Cl.[4] .............................................. H01R 13/00
[52] U.S. Cl. .......................................... 439/69; 439/70
[58] Field of Search .............. 339/17 CF, 17 M, 17 N

[56] References Cited

U.S. PATENT DOCUMENTS

| | | | |
|---|---|---|---|
| 3,789,341 | 1/1974 | Dalmasso | 339/17 CF |
| 4,364,620 | 12/1982 | Mulholland et al. | 339/17 CF |
| 4,406,508 | 9/1983 | Sadigh-Behzadi | 339/17 CF |
| 4,471,158 | 9/1984 | Roberts . | |
| 4,588,239 | 5/1986 | Venaleck | 339/17 CF |

FOREIGN PATENT DOCUMENTS 96753 6/1984 Japan .............................. 339/17 CF Primary Examiner—Daniel C. Crane
Attorney, Agent, or Firm—Eric J. Groen

[57] ABSTRACT

A socket for stacking and interconnecting corresponding leads of two integrated circuit packages having the contacts stamped and formed in a lead frame configuration with a dielectric body molded over a portion of the terminal ends. Two contact halves are sheared from the opposite end of the terminal, one contact formed upwardly while the second contact is formed downwardly. Integrated circuit package leads can be selectively commoned by jumpering the terminal ends prior to molding the body.

17 Claims, 16 Drawing Figures

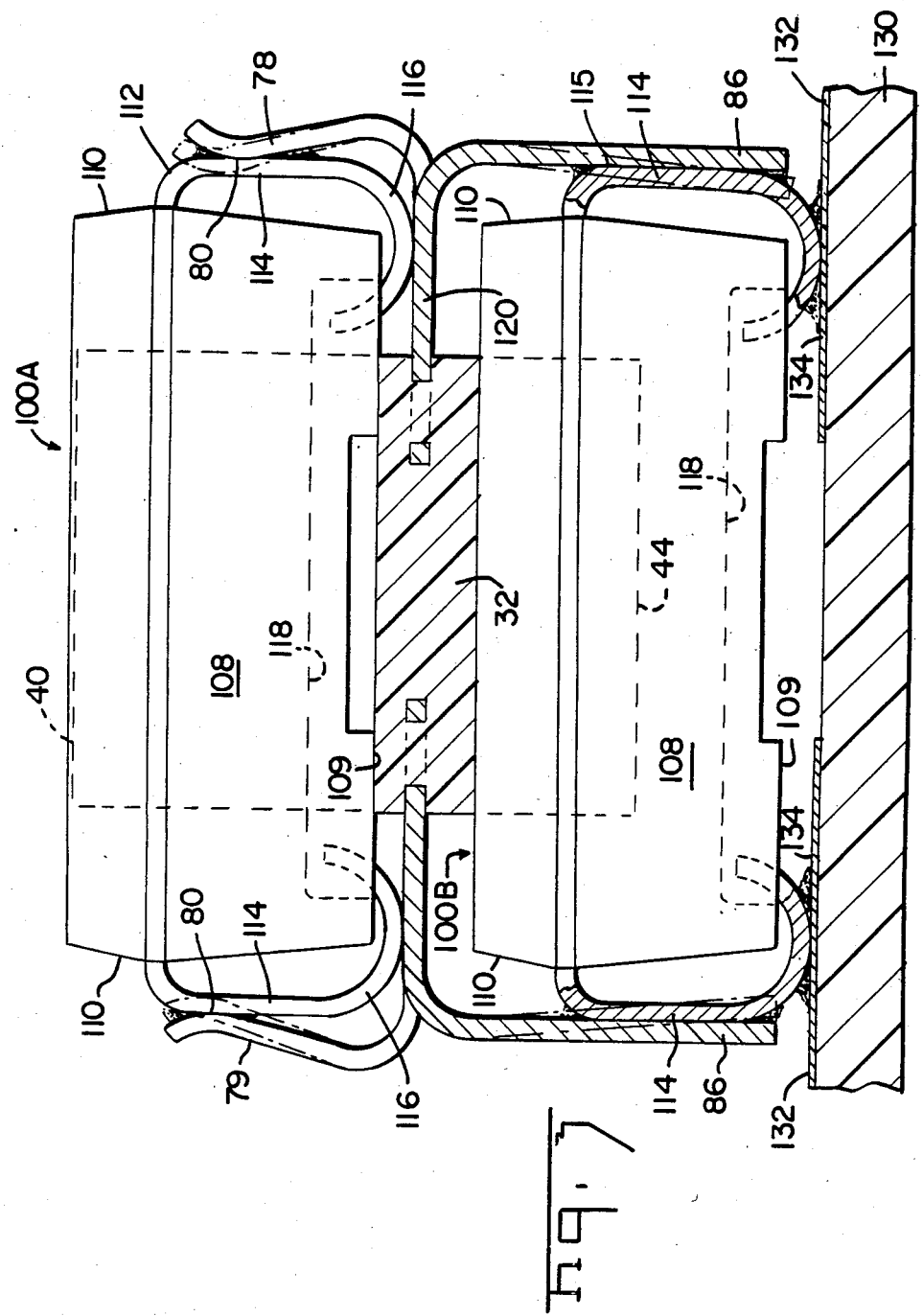

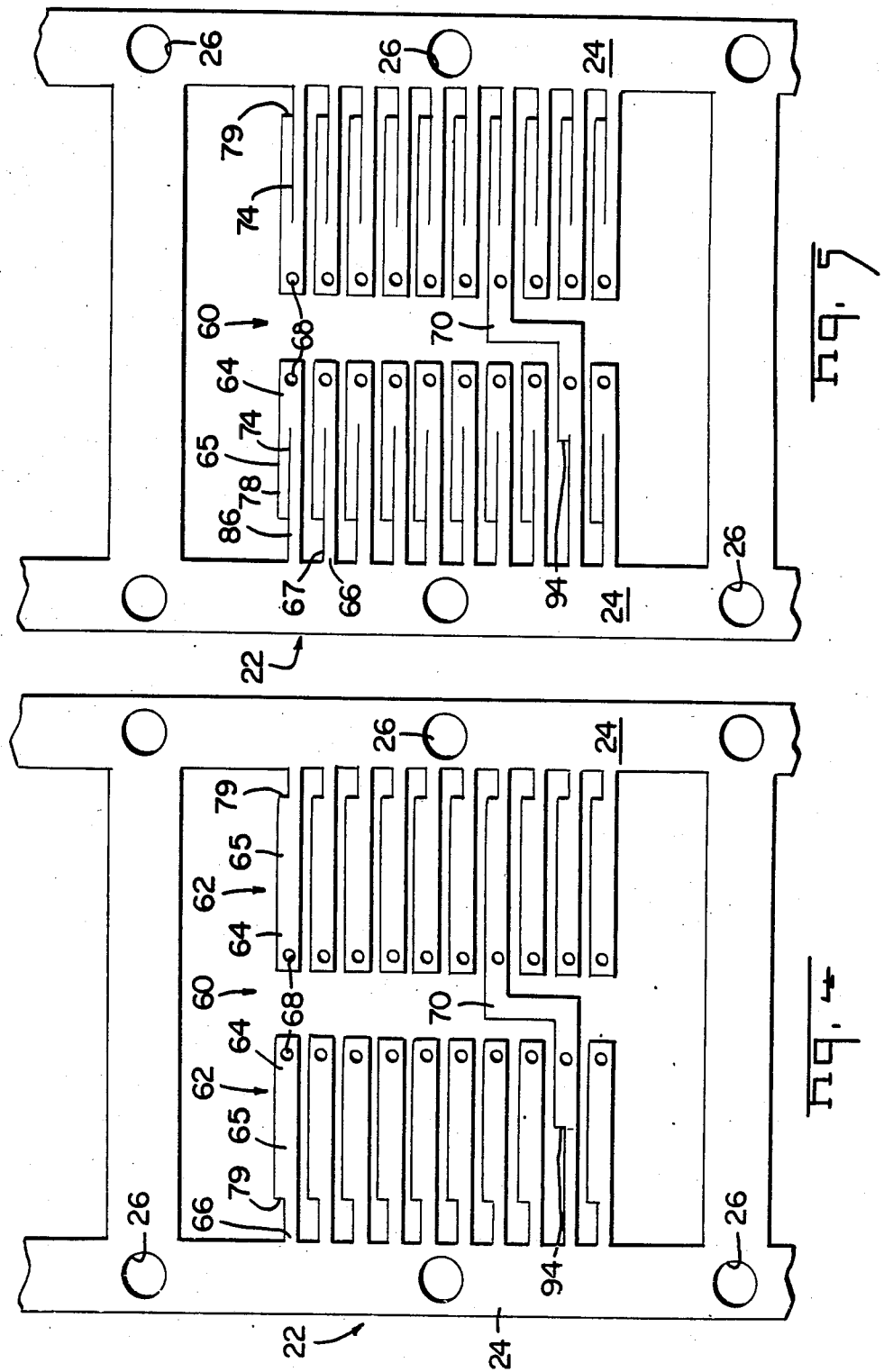

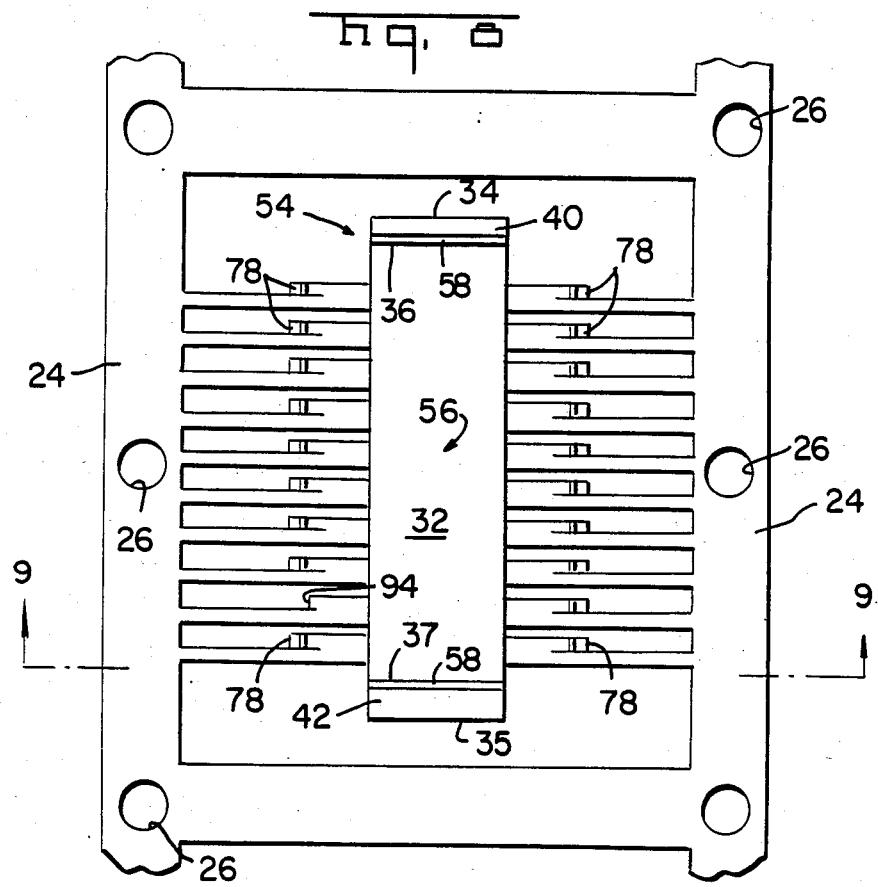
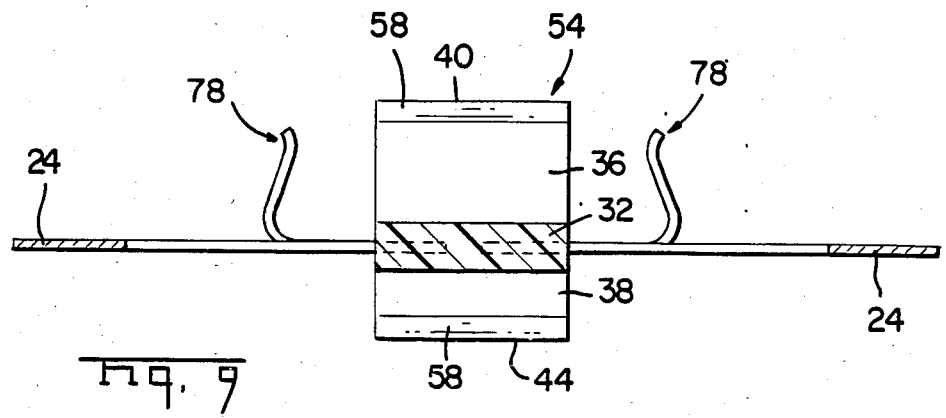

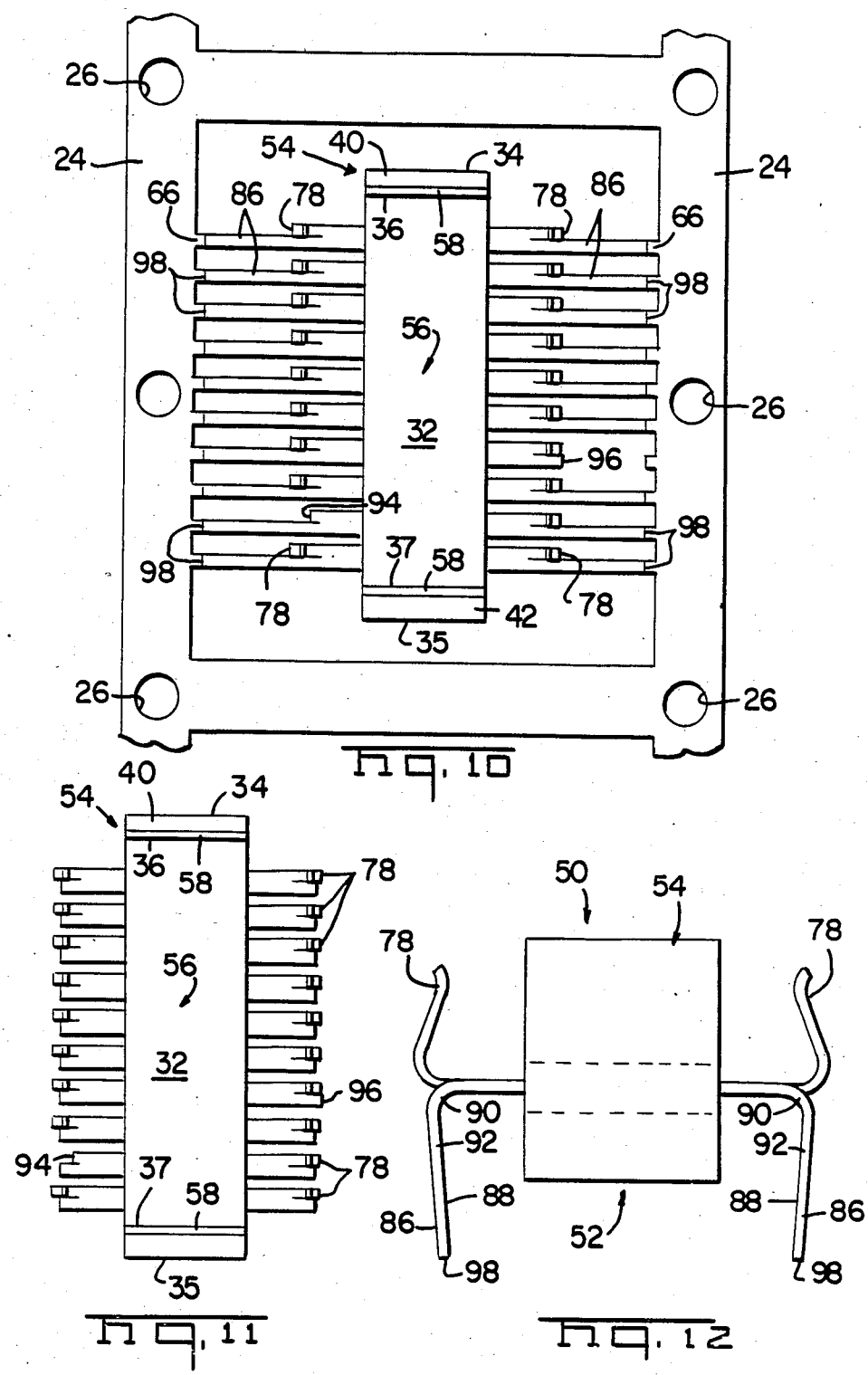

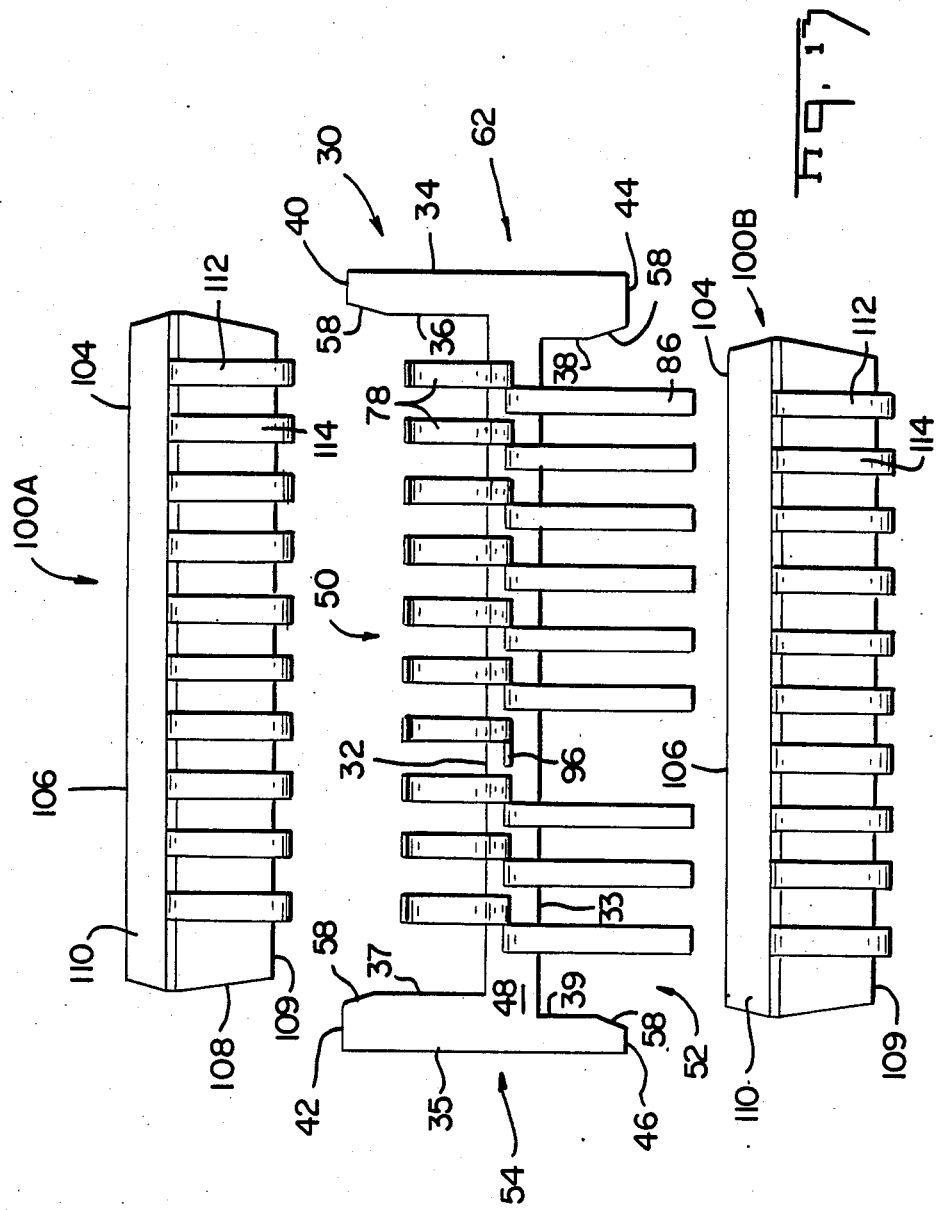

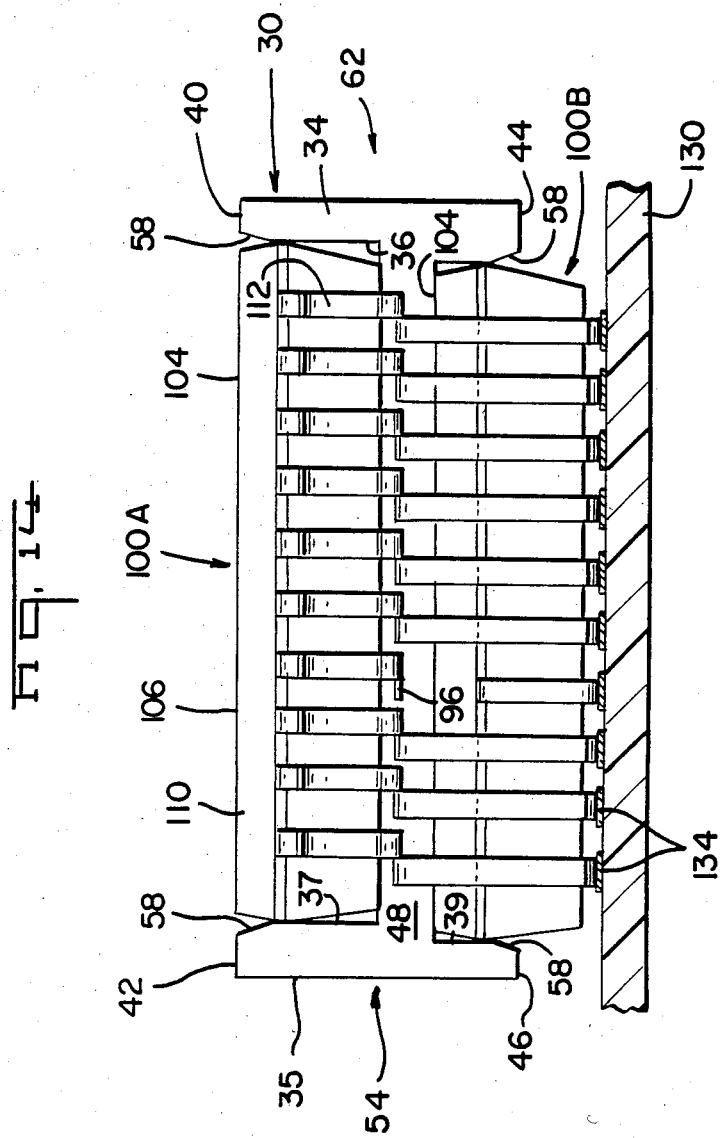

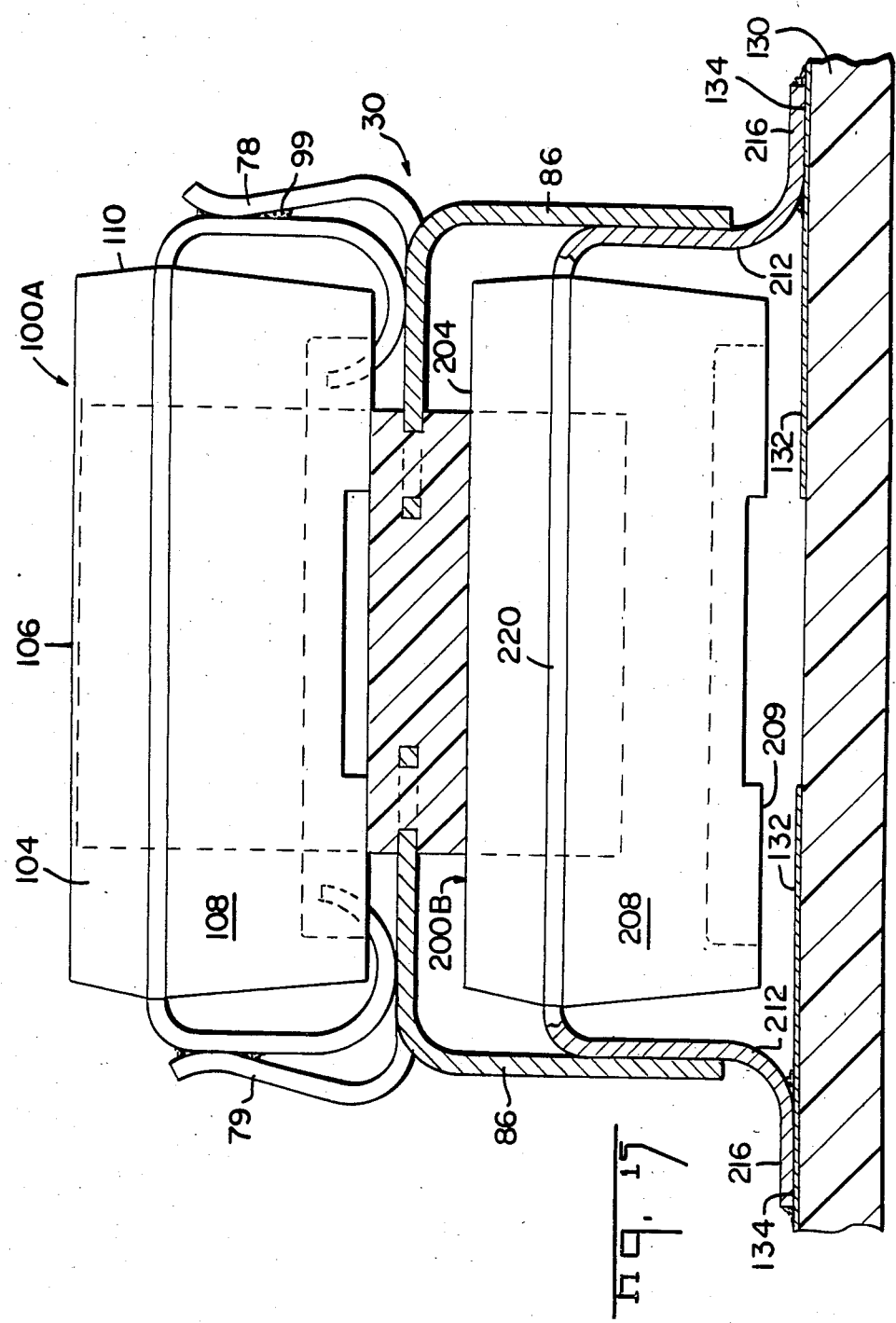

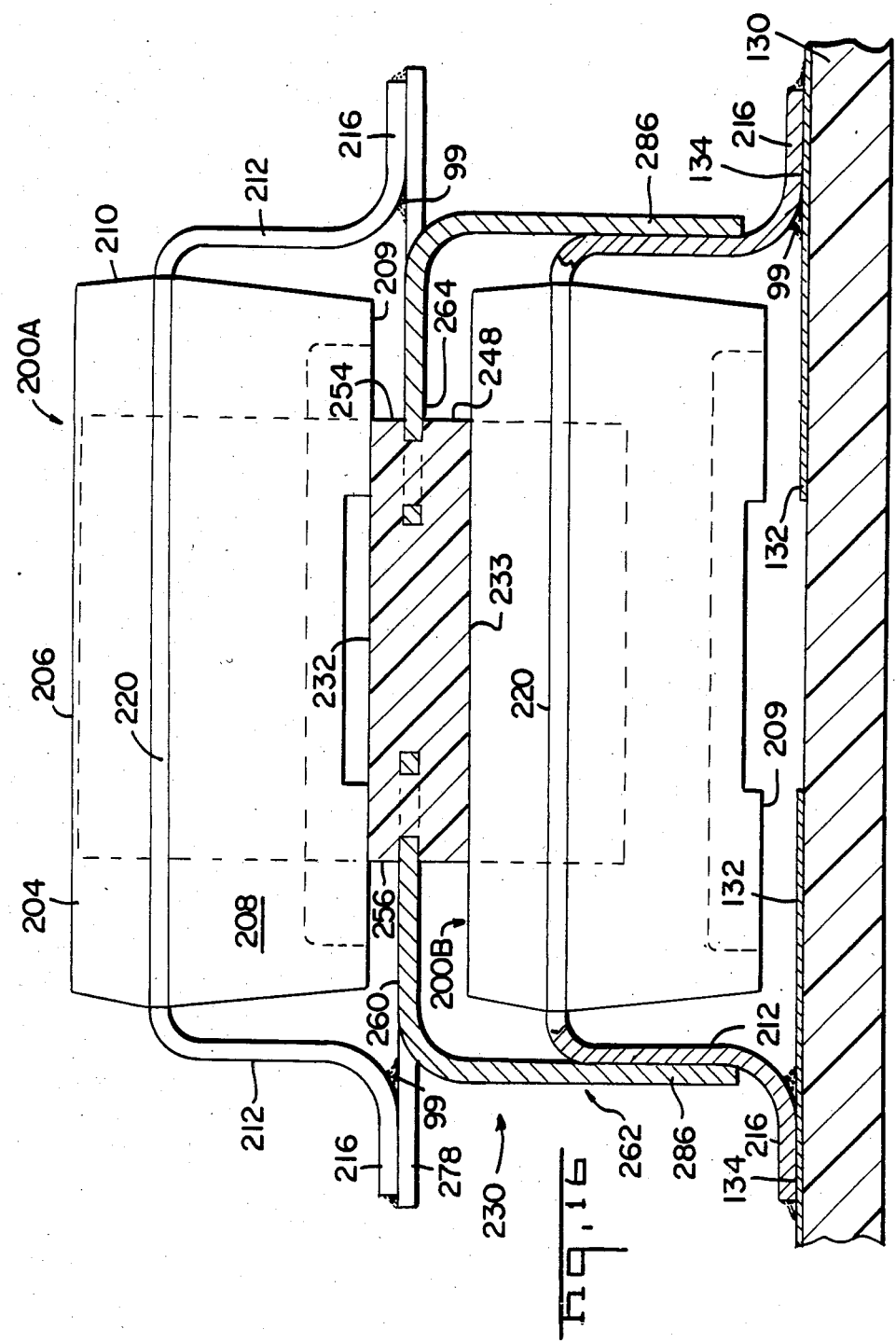

SOCKET FOR STACKING INTEGRATED CIRCUIT PACKAGES

BACKGROUND OF THE INVENTION

1. Field of the Invention

The present invention relates to an electrical device for stackably interconnecting two integrated circuit packages and commoning corresponding package leads.

2. Prior Art

There are many instances where it is desirable to interconnect corresponding leads of integrated circuit packages and more importantly to stack the packages thereby saving printed circuit board space. Some instances call for stacking integrated circuit packages to increase the memory cabilities while others call for combining various integrated circuit packages, such as a microprocessor package and a memory unit.

Integrated circuit packages are packaged in leadless and leaded configuration. A leadless integrated circuit package contains no leads but rather contains conductive pads on the edges of the chip substrate for interconnection to a stackable conductor. An example of a stackable interconnection for leadless integrated circuit packages can be found in U.S. Pat. No. 4,018,494. A lead frame approach can be used for interconnecting components with a leadless integrated circuit package, see U.S. Pat. No. 4,142,287. On the other hand, integrated circuit packages can be leaded, having leads projecting outwardly from the circuit substrate. It is the latter leaded configuration to which the subject invention is addressed.

Leaded integrated circuit packages can be formed in various configurations but most importantly for this discussion, the typical configuration is the dual in-line package (DIP). The DIP comprises an integrated circuit interconnected to a lead frame, the integrated circuit being totally enclosed within a dielectric body; the leads being partially enclosed within the body.

The integrated circuit package body generally includes a top and bottom surface, and side and endwalls. The DIP has leads extending outwardly from the sidewalls then bending downwardly. The leads are placed in opposed parallel rows and typically range from 4–60 leads per package.

Other common configurations for integrated circuit packages include the SOIC, the SOJ and the square package, although each of these involve a plastic body having leads extending from the body. The SOIC, or gull-wing, has leads extending outwardly from the package sidewalls, the leads then bent outwardly to form feet parallel to the top and bottom surface and parallel to the printed circuit board to which they are mounted. The SOJ packages have leads extending outwardly from the sidewalls but the leads are then formed under the package body, the leads being formed in the shape of a "J". Square packages are integrated circuit packages having the plastic body formed in a square shape with leads extending from all four sides of the body.

Typical stacking arrangements for integrated circuit packages involve commoning the same respective leads on stacked packages, that is, when stacking two 8-pin DIPs, pin 1 on the first DIP would be commoned with pin 1 of the second DIP, and so on through pin 8. Conditions do exist however where a lead on the upper package must be commoned to a lead on the opposite side of the lowor package, thus complicating the interconnection. Using the same 8-pin example above, pin 3 on the top DIP would be commoned to pin 6 on the lower DIP.

Another problem with presently available designs for stacking DIP connectors is that terminals within the connectors are individually formed and placed in their respective socket housing, creating manufacturing and handling difficulties. Several designs of connectors are presently available utilizing the individually formed terminals, for example, see U.S. Pat. Nos. 4,080,026; 4,312,555; 4,406,508; 4,116,519; 4,192,565; and 4,356,532.

It can be appreciated then that a connector designed such that the terminals are formed in carrier strip or lead frame configuration with the socket housing molded around the terminals, would be a significant advance in the technology, requiring much less cost for maufacturing. At least one design presently exists where the terminals are formed in a lead frame configuration, see for example U.S. Pat. No. 4,364,620.

As best shown in FIGS. 10 and 12 of the '620 patent, the terminals are initially formed in a lead frame configuration. The housing is not formed around the lead frame but rather the lead frame is bent around lines 150 of FIG. 10, producing a configuration having an end view as shown in FIG. 1 and then inserted in the housing. The bending process precludes the possibility of commoning leads on the opposite sides of the upper and lower DIPs, as in the bent configuration of FIG. 11, terminals 88 and 136 are separated further apart than in the lead frame configuration. As the lead 88 and 136 are further spread after the bending operation, they could not possibly be connected to each other.

SUMMARY OF THE INVENTION

The present invention relates to a socket for interconnecting two integrated circuit packages, the packages having a plurality of leads extending from the package in lead frame configuration. The socket has a dielectric body for supporting and aligning the circuit packages for commoning.

The circuit packages are commoned by terminals having an end partially embedded in the dielectric socket body. The terminal also includes two contact arms, one formed upwardly of the socket and the other formed downwardly from the socket. Placing the integrated circuit packages in the socket body connects the leads of the packages to the terminals commoning the leads of the stacked packages.

BRIEF DESCRIPTION OF THE DRAWINGS

FIG. 3 is a cross-sectional view taken through lines 3—3 of FIG. 1.

FIG. 4 is a top plan view of the terminal lead frame and carrier strips after the first stamping operation.

FIG. 5 is similar to FIG. 4 after the terminal ends have been sheared.

FIG. 8 is a top plan view similar to FIG. 6 showing the body molded to the carrier strip.

FIG. 9 is an end view of the lead frame and carrier strip taken through lines 9—9 of FIG. 8.

FIG. 10 is similar to FIG. 8 showing the shear lines of the lower contact portions.

FIG. 11 is a top plan view of the socket.

FIG. 12 is an end plan view of the socket.

FIG. 13 is a front plan view of the socket.

FIG. 14 is a view similar to FIG. 10 showing the integrated circuit packages in place.

FIG. 15 is a view similar to FIG. 3 showing an alternate embodiment, the socket interconnecting an SOJ integrated circuit package with a gull-wing configuration integrated circuit package.

FIG. 16 is a view similar to FIG. 15 showing an alternate embodiment, the socket interconnecting two gull-wing integrated circuit packages.

DETAILED DESCRIPTION OF THE PREFERRED EMBODIMENTS

Figure 1:
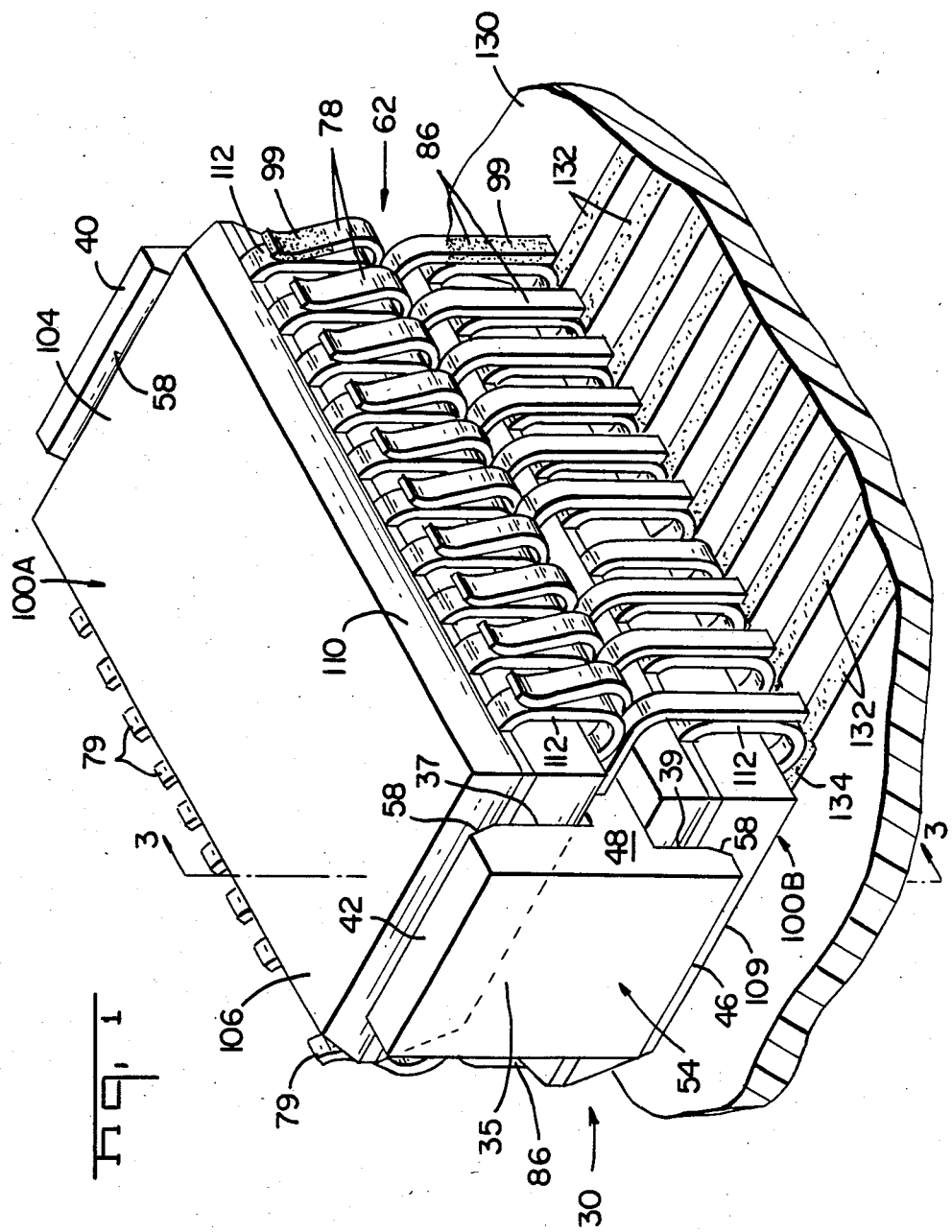
FIG. 1 is a perspective view of the preferred embodiment showing two integrated circuit packages placed within the socket.

There is shown generally in FIG. 1 a socket 30 for stackably interconnecting two integrated circuit packages 100A and 100B. The preferred embodiment of the invention shows interconnection for two SOJ packages, although it will be apparent from the following discussion that the design will be available for other configurations of DIP sockets.

Figure 2:
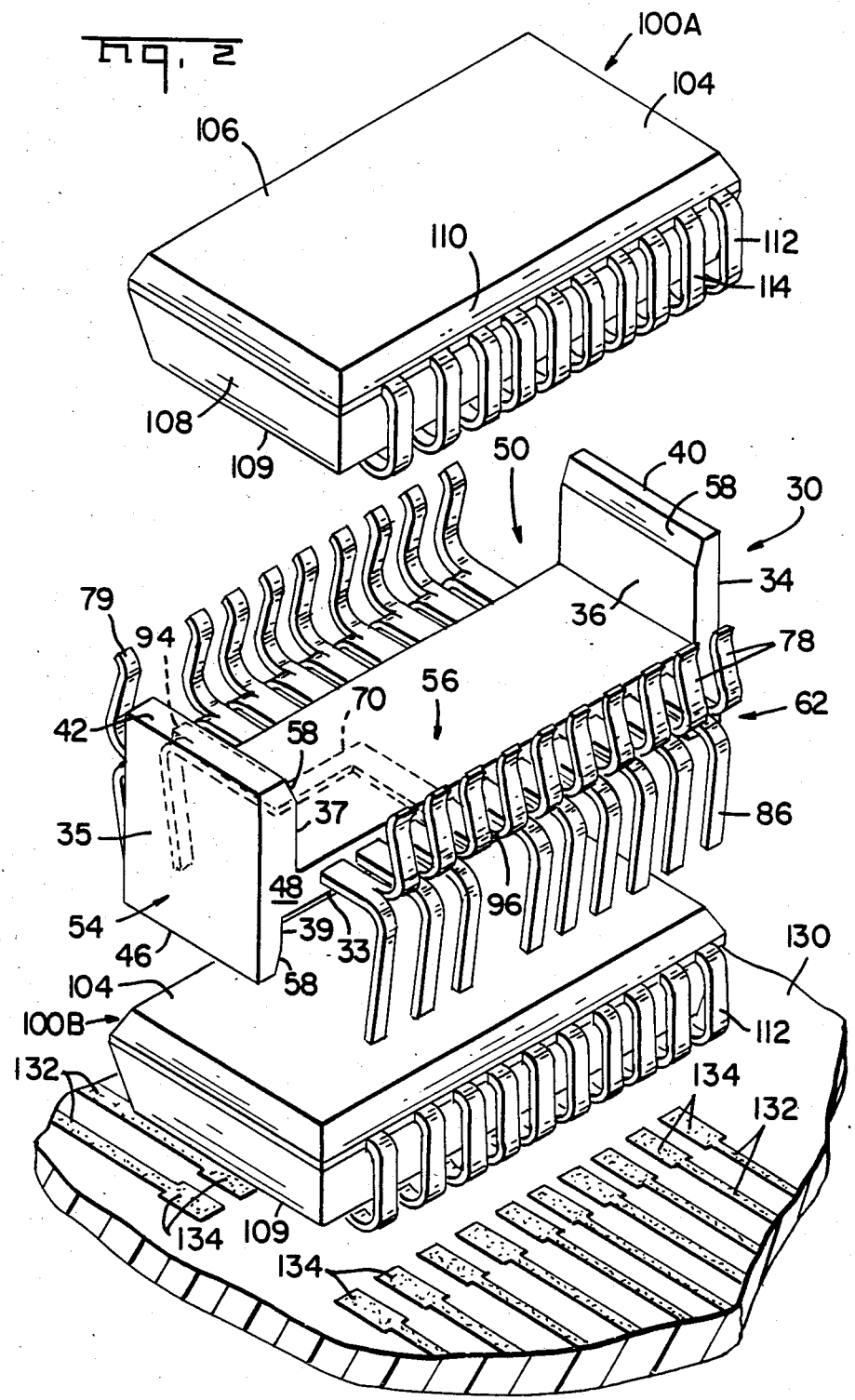
FIG. 2 is a view similar to that of FIG. 1 showing the integrated circuit packages exploded from the socket body.

The preferred embodiment of the SOJ package 100 is an integrated circuit package having a lead frame encapsulated in a plastic body 104, as best shown in FIGS. 2 and 3. The plastic body encapsulates the integrated circuit and comprises a top surface 106 and bottom surface 109, and endwalls 108 and sidewalls 110. The integrated circuit package shown in FIG. 2 has twenty leads 112, two parallel and opposed rows, extending from the sidewalls 110. Although it is typical in the industry to have integrated circuit packages ranging from four to sixty leads, it will be apparent from the following discussion that the subject socket can be made to accommodate any sized package.

An SOJ package as best shown in FIG. 3 has leads 112 extending from sidewalls 110, then bent downwardly having a straight portion 114 adjacent the sidewalls 110. The leads 112 are then bent again at 116 forming a "J" portion, the opposed leads projecting inwardly and then up against the package bottom surface 109.

Referring again to FIG. 2, socket 30 is shown having a plurality of terminals 62 having a portion embedded within molded body 54. Body 54 comprises a central portion 56 and endwalls 34 and 35; endwall 34 having upper and lower portions 40 and 44 respectively, while endwall 35 having upper and lower portions 42 and 46, respectively.

Socket 30 is also shown having an upper package receiving nest 50 and a lower package receiving nest 52. Upper nest 50 is defined by inner surface 36 of upper portion 40, floor 32 and inner surface 37 of upper portion 42. Lower nest 52 is defined by inner surface 38 of lower portion 44, ceiling 33 and inner surface 39 of lower portion 46.

Still referring to FIG. 2, terminals 62 are shown encapsulated within the central portion 56 of body 54, and extending through sidewall 48, the terminals 62 arranged in two parallel and opposed rows. Terminals 62 are also shown as having upstanding contact arms 78 and downwardly pointed contact arms 86. Each of the contact arms 78, 86 have solder 99 predisposed thereon, the solder being disposed by a conventional method, preferably by electroplating.

FIG. 2 is exemplary of the subject preferred embodiment showing two integrated circuit packages 100A and 100B poised for receipt in their respective nests 50 and 52 and leads 112 of upper 100A and lower package 100A for contact with upper and lower contact arms 78 and 86, respectively. The subject socket 30, in addition to commoning respective package leads 112 of upper and lower packages 100A and 100B, has the ability for commoning a lead 112 of an upper package 100A with a lead 112 of a lower package 100B, the leads being on opposed sides and not linearly opposed. For example, FIG. 2 shows jumper portion 70 (in phantom) connecting terminal 62 at position 4 with terminal 62 at position 19 which commons lead 112 of the upper package 100A at position 4 with lead 112 of the lower package 100B at position 19, which is the commoning required for the Texas Instruments package TMS 4256, a 256K dynamic RAM. Where this commoning configuration is desired, the socket design must ensure that the lead 112 of upper package 100A at position 19 is not also commoned to the lower package lead 112 at position 19, and likewise, the lead 112 of lower package 100B at position 4 is not commoned with the lead 112 of upper package 100A at position 4. To this end, the lower contact portion 86 at position 4 and the upper contact portion 78 at position 19 must be removed, as shown in FIG. 2 leaving sheared tabs 96 and 94.

It should be readily apparent that the subject socket allows for any combination of selective jumpering between terminals, or for no jumpering at all. However for the discussion that follows respecting the manufacturing of the subject socket, the configuration as shown in FIG. 2 will be described.

The manufacturing of the preferred embodiment of the socket 30 begins by stamping and forming the terminals from carrier strip stock. Referring now to FIG. 4, the first stamping operation to the carrier strip 22 leaves a lead frame configuration 60, having two parallel and opposed rows of frame strips which ultimately form socket leads or terminals 62. The terminals 62 have central portions 64 and contact portions 65. Each terminal 62 remains affixed to carrier strip section 104 by tabs 66. The terminals 62 are stamped out such that the terminals 62 are twice the width of the tabs 66, which accounts for stamped end 79 of contact section 65. It should also be noted that jumper section 70 remains, interconnecting central portions 64 of positions 4 and 19. Each central portion 64 also contains a stamped out hole 68 which will be discussed more fully later. It should be understood that this stamping operation might be carried out in a progressive die.

Referring now to FIG. 5, the terminal sections 65 have been sheared along shear line 74 forming upper and lower contact sections 78 and 86, respectively. Shear line 74 separates the contact section 65 into the respective contacts, and is contiguous with edge 67 of tab 66. It should also be noted that upper contact portion 78 at position 19 has already been sheared off, leaving sheared end 94.

After the contact section 65 has been sheared, solder 99 is disposed on the contact sections 78 and 86. The preferred method for disposing the solder on the contacts 78, 86 is by electroplating the solder thereon. The solder could be selectively applied to only plate the upper and lower contact sections 78 and 86, however, the preferred embodiment includes the complete lead frame 60 and carrier strip 24 of FIG. 5 solder plated, thereby foregoing the expense of selective plating.

Figure 6:
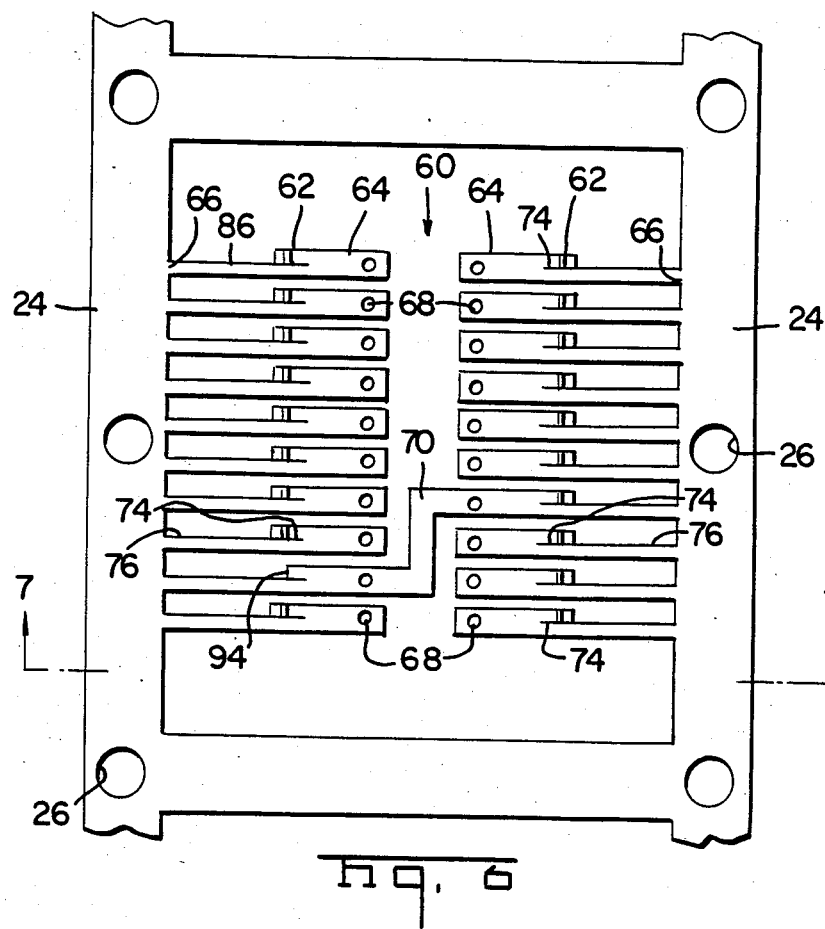
FIG. 6 is a top plan view of the terminal lead frame and carrier strip having the upper contact arm formed.
Figure 7:
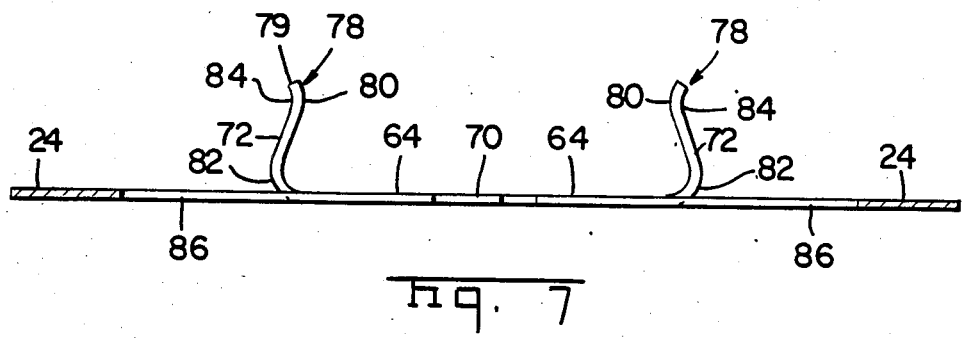
FIG. 7 is an end plan view of the lead frame and carrier strip taken through lines 7—7 of FIG. 6.

Referring next to FIGS. 6 and 7, upper contact portions 78 have been formed upward, exposing sheared edge 76 of lower contact portion 86 and sheared edge 72 of upper contact portion 78. As best shown in FIG. 6, it is now more apparent that lower contact portion 86 is the same width as tab portion 66. and that lower contact portion 86 and tab portion form a smooth transition being attached to carrier strip sections 24.

As best shown in FIG. 7, upper contact portions 78 have been formed into their final configuration while lower contact portions 86 remain in the plane of the central portions 64. Upper contact portion 78 is formed by first bending the contact portion 78 upwardly creating a bend at 82, which projects the two opposed contact portions 78 inwardly toward one another. The contact portion is then bent again forming a bend 84 reversing the direction of the contact portions 78, now projecting the contact portions outwardly. The combination of first and second bends 82 and 84 create two opposed rows of contacts suitable for receiving an integrated circuit package 2. The second bend 84, with a radius of curvature outwardly, creates an inward facing point of contact at point 80 on each opposed terminal 78. The first bend at 82 creates a resilient nature in contact portion 78 which produces a normal force against package leads 112.

After the upper contact portion is formed, the body 54 is molded over the lead frame 60 encapsulating the central portions 64 of the terminals 62 within the molded body. Two die halves are placed over the lead frame 60, one above and one below the carrier strip 102 encapsulating within the mold the central portions 64, and a molten plastic is injected into the mold. The die cavities are configured so as to mold the complete body, 54 as shown in FIGS. 8 and 9, the body 54 comprising a central section 54 with endwalls 35 and 35.

Referring again to FIG. 6, each terminal central portion 64 has a stamped hole 68. When the molten plastic is injected into the mold and forced into the extremities of the cavities, the plastic fills the voids created by the stamped holes 68. As best shown in FIG. 3, the molten plastic which makes the body central portion 56 surrounds the terminal central portions 64 and fills the stamped holes 68. When the plastic body has cooled and firmly set, the plastic filling the holes in communication with the plastic above and below the terminal central portion 64, will ensure that the terminals 62 are securely embedded within the molded body 54.

Up through the injection molding process, all operations are performed with the lower contact portion 86 of terminals 62 attached to the carrier strip sections 24 by means of tabs 66. Referring now to FIG. 10, the lower contact portions 86 are sheared away from tab 66, forming a sheared end 98 on lower contact portion 86; contact portions 86 still lying in the parallel plane of central portions 64..

The lower contact portions 86 are then bent downwardly to form the final configuration of FIGS. 11 and 12. Referring now to FIG. 12, lower contact portions 86 are bent at 90 projecting contact portion 86 downwardly. The contact portion consists of straight section 92 inside contact surface 88 and sheared end 98. The bend 90 creates a resiliency in lower contact portion 86 which applies a natural normal force against leads 112 of lower integrated circuit package 100B. Having molded the body 54 about the terminals 62, and having formed upper contact portions 78 and lower contact portions 86, the upper IC receiving nest 50 and lower IC receiving nest 52 are complete and capable of receiving upper and lower IC packages 100A and 100B, respectively.

To stack the upper and lower IC packages 100A and 100B to the final configuration as shown in FIG. 1, each of the upper and lower packages 100A and 100B are placed in their respective receiving nest 50, 52. There are numerous methods by which the integrated circuit packages 100A, 100B could be placed in the socket 30 and soldered in place within their nests 50, 52 and on the printed circuit board 130. A first method is to place the complete unit, the upper and lower integrated circuit packages 100A and 100B inserted within the socket 30, on the printed circuit board 130 aligning the leads 112 of the lower integrated circuit package 100B with the solder pads 134. The assembly is then heated by conventional solder reflow means such as infrared, vapor phase reflow, and the like, to melt the solder pads 134 and the solder 99 on the contacts 78, 86, concurrently. In such a case the melting point of the solder 99 and the solder pads 134 should be approximately the same.

A second method is to place the two integrated circuit packages 100A and 100B within their respective nests 50 and 52, and melt the solder 99, soldering only the connection between leads 112 and contacts 78, 86. The two integrated circuit packages 100A and 100B, and the socket 30 is then placed on the printed circuit board 130 aligning lower contacts 86 with solder pads 134. The solder pads are then heated, melting the pads 134 and soldering the lower integrated circuit package 100B to the printed circuit board 130. In this case, the solder pads 134 are composed of a solder having a lower melting point than the solder 99, preventing the remelting of solder 99.

A third method is to place only the lower integrated circuit package 100B on the printed board 130 aligning the lower contacts 86 with the solder pads 134. Heat is then applied to melt the solder pads 134 effecting a soldered joint between the lower integrated circuit package 100B and the printed circuit board 130. The socket 30, with the upper integrated circuit package already inserted therein, is placed over the lower integrated circuit package 100B. Heat is then applied to the contacts to melt the solder 99 effecting an interconnection between the leads 112 and the contacts 78, 86. In this instance the melting point of the solder 99 should be lower than that of the solder pads 134, to prevent remelting of the solder pads 134. Regardless of the method, the final soldered configuration effects a mechanical and electrical interconnection between the package "J" lead portion 116 and solder pads 134, contact points 88 of lower contact arm 86 and flat section 114 of lower package 100B and contact points 80 of upper contact arm 78 with flat section 114 of upper package 100A.

Referring now to FIG. 2, the lower integrated circuit package 100B is soldered directly to the printed circuit board 130, the "J" portions 116 connected to the solder pads 134. As the "J" portions 116 of the leads 112 are formed under the package 100B, the floor 109 of the package 100B is naturally elevated away from the printed circuit board 130.

The lower contact portion 86 and the upper contact portion 78 contact the package leads at a contact point 115 on lead 112 and point 80 on lead 78. Preferably, point 115 is on the straight portion 114 just below the plane of the central leads 120 of terminals 62. The respective contacts should mate with the package leads 112 at point 115. Referring now to FIG. 3, it can be seen that the "J" portions 116 are not embedded within the plastic body 108 of package 100A but, rather are folded under the body 108, each lead extending into an aperture 118. In order to ensure high contact forces between point 80 of upper contact 78 and point 115 of lead 112, and the deflection between those same points low, the point of contact should be as close to the plane through central leads 120 as possible yet remaining on the straight portion 114.

The lower package 100B is soldered to the printed circuit board 130 at solder pads 134, and the connection point between "J" portion 116 and the solder pads 134 should be compliant to allow for thermal expansion. If the contact between lower contact 86 and lead 112 of package 100B is too low, the resiliency in contact 86 increases the strength of the lead 112, disallowing thermal expansion. Thus the contact between lower contact 86 is made at point 115 of lead 112.

As designed, it is possible to control the contact of point 88 of lower contact portion 86 with contact point 115 on lower IC package 100B, and the contact of point 80 of upper contact portion 86 with contact point 115 on upper IC package 100A. As best shown in FIG. 3, socket ceiling 33 rests on package top surface 104, maintaining the vertical distance between the central portion 64 and the contact point 115 on package lead 112, thereby ensuring the proper contact between contact points 88 and 115. Also, upper IC package 100A rests on socket central portion 56, package bottom surface 109 on socket floor 32 thereby maintaining the vertical distance between the plane through central portions 64 and the contact point 115 on leads 112.

Referring now to FIGS. 13 and 14, it can be seen that the subject socket 30 is designed so as to longitudinally align the leads 112 of upper package 100A with the upper contact portions 78 and leads 112 of lower package 100B with the lower contact portions 86. As shown in FIG. 13, the upper and lower contact portions 78 and 86, respectively, are sheared halves bent upwardly and downwardly. As such, the center lines of the contact portions are longitudinally offset from each other. To align the respective leads 112 and contacts 78, 86, the molded body 54 includes outer walls 34 and 35; wall 34 comprising thin section 50 and thick section 44, and wall 35 comprising thick section 42 and thin section 46. Thus, when upper package 100A is placed in upper package receiving nest 50, the package is right justified to align the leads 112 and contacts 78, the package sidewalls 108 being guided by inner surface 36 of endwall 40 and inner surface 37 of endwall 42. When lower package 100B is placed in lower package receiving nest 52, the package is left justified to align the leads 112 and contacts 86, the package sidewalls being guided by inner surface 38 of endwall 44 and inner surface 39 of endwall 46. To assist the integrated circuit packages into their respective package receiving nests 50, 52, the endwalls 40, 42, 44 and 46 include chamferred lead-in surfaces 58.

Referring now to FIG. 15, the configuration shown represents a first alternate embodiment of the subject invention. The socket 30 stackably interconnects two integrated circuit packages 100A and 200B, an SOJ package, and a gull-wing package, respectively. The gull-wing package 200B comprises a lead frame 220 encapsulated within a plastic body 208. The leads 212 extend outwardly from the body 208 and are then bent outwardly from the body 208 to form a foot 216. The feet 216 of lower package 200B are affixed to the printed circuit board 130 by solder pads 134. Socket 30 and package 100A are designed in the same manner as the preferred embodiment.

A second alternate embodiment of the subject invention as shown in FIG. 16, relates to a socket 230 for interconnecting two gull-wing integrated circuit packages 200A and 200B. Both packages 200A and 200B have terminals 212 and feet 216. The socket 230 has a lead frame 260 attached to a plastic body 254, the terminal central portions being encapsulated within the central portion 256 of plastic body 254. The upper contact portions 278 extend outwardly in the same plane as the lead frame 260, such that the feet 216 of upper package 200A rest thereon. The lower lead frame portions 286 extend downwardly extending over leads 212 of lower package 200B.

In its final configuration, the socket 30 stacks and selectively commons leads from the IC package soldered to a printed circuit board with leads of the stacked package. The explanation of the preferred embodiment is exemplary and should not be used to limit the scope of the claims.

What is claimed is:

1. A socket for interconnecting two integrated circuit packages, each having a plurality of package leads extending from opposite sides, the socket comprising means for stacking the two integrated circuit packages and commoning package leads, the socket further comprising:

a central body, and a plurality of socket leads, each lead comprising a central portion lying along a central plane common with all central portions, each central portion being partially embedded within the body and extending therefrom, and two contact arms extending from the associated central portion, the arms extending in opposite directions from the plane of the central portion, a first plurality of contact arms extending upwardly and transversely of the central plane establishing a first socket, and a second plurality of contact arms extending downwardly and transversely of the central plane to establish a second socket, whereby the contact arms interconnect the package leads of the integrated circuit packages, one package disposed above and one package disposed below the socket body.

2. A socket for interconnecting two integrated circuit packages, each having a plurality of package leads extending from the sides thereform, the socket comprising means for stacking the two integrated circuit packages and commoning package leads, the socket further comprising:

a central body, and a lead frame forming a plurality of stamped and formed socket leads, each socket lead comprising a central portion lying along a central plane common with all central portions, each central portion being partially embedded within the body and extending therefrom, and two contact arms extending from the associated central portion formed in opposite directions from the plane of the lead frame defining a first plurality of contact arms formed upwardly and transversely of the central plane establishing a first socket, and a second plurality of contact arms formed downwardly and transversely of the central plane establishing a second socket, whereby the contact arms interconnect the package leads of the integrated circuit packages, one package disposed above and one package disposed below the socket body.

3. The socket of claim 2 wherein each two associated contact arms are laterally offset from each other.

4. The socket of claim 3 wherein each contact arm, of the two associated laterally offset contact arms, are integral with the central portion, each contact arm having a width substantially equal to one-half the width of the central portion.

5. The socket of claim 2 wherein the body comprises an overmolded insulative body.

6. The socket of claim 5 wherein the central portion of the socket lead includes retention means securely embedding each socket lead within the body.

7. The socket of claim 6 wherein the retention means comprises a hole in the central portion of the socket lead.

8. The socket of claim 2 wherein socket leads extend from opposite sidewalls of the body.

9. The socket of claim 8 wherein at least one socket lead extending from one sidewall is interconnected to a socket lead extending from the opposite sidewall, the interconnected socket leads being joined by an intermediate jumper portion, the jumper portion comprising a portion of the lead frame.

10. The socket of claim 9 wherein the jumper portion is integral with and extends between central portions of oppositely extending interconnected socket leads.

11. The socket of claim 10 wherein the package leads interconnected by the jumper are located at laterally displaced position along opposite sidewalls of the body.

12. The socket of claim 2 wherein the body includes two endwalls extending from the top of the body and two endwalls extending from the bottom of the body, the endwalls comprising means for positioning the package leads in alignment with corresponding socket leads.

13. The socket of claim 12 wherein the endwalls further comprise means for positioning package leads in alignment with corresponding laterally offset socket leads.

14. The socket of claim 13 wherein the top endwalls comprise one thin endwall and one thick endwall, and the bottom endwalls comprise a thin endwall and a thick endwall, the top and bottom endwalls at the same end having different thicknesses, whereby the top and bottom endwalls justify the top and bottom integrated circuit packages aligning the package leads with the laterally offset upper and lower contact arms.

15. The socket of claim 2 wherein solder is disposed on at least a portion of the contact arms.

16. A socket for interconnecting two integrated circuit packages, each package having a plurality of package leads extending from opposite sides, the socket comprising means for stacking the two integrated circuit packages and commoning package leads, the socket further comprising:

a contact lead frame having two parallel opposed rows of terminals, each terminal having a central portion lying in a central parallel plane adjacent to central portions in the opposed row and at least one jumper portion electrically interconnecting a central portion of one row with a central portion of the opposite row, and two contact arms extending from each central portion, one arm formed upwardly and transversely of the central parallel plane and one arm formed downwardly and transversely of the central parallel plane, and a central body molded over the central portion of the terminals, encapsulating the central portions therein, whereby the contact arms interconnect the package leads of the integrated circuit packages, one package disposed above and one package disposed below the socket body.

17. The socket of claim 16 wherein the length of an upper arm on one of the electrically interconnected terminals is profiled in a noncontacting relationship with an adjacent package lead on a mateable upper package and the length of a lower arm on the other electrically interconnected terminal is profiled in a noncontacting relationship with an adjacent lead on a mateable lower package.

* * * * *